(12) United States Patent
Kuse et al.

(10) Patent No.: US 9,178,147 B2
(45) Date of Patent: Nov. 3, 2015

(54) RESISTIVE-SWITCHING MEMORY ELEMENTS HAVING IMPROVED SWITCHING CHARACTERISTICS

(71) Applicant: Intermolecular, Inc., San Jose, CA (US)

(72) Inventors: Ronald J. Kuse, San Diego, CA (US); Tony P. Chiang, Campbell, CA (US); Imran Hashim, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/619,434

(22) Filed: Feb. 11, 2015

(65) Prior Publication Data

US 2015/0155486 A1    Jun. 4, 2015

Related U.S. Application Data

(63) Continuation of application No. 14/255,749, filed on Apr. 17, 2014, now Pat. No. 9,012,881, which is a continuation of application No. 13/656,908, filed on Oct. 22, 2012, now Pat. No. 8,723,156, which is a continuation of application No. 12/705,474, filed on Feb. 12, 2010, now Pat. No. 8,343,813, which is a continuation-in-part of application No. 12/608,934, filed on Oct. 29, 2009, now Pat. No. 8,183,553.

(60) Provisional application No. 61/168,534, filed on Apr. 10, 2009.

(51) Int. Cl.
| | |
|---|---|
| *H01L 45/00* | (2006.01) |
| *H01L 47/00* | (2006.01) |
| *H01L 27/01* | (2006.01) |
| *H01L 29/739* | (2006.01) |
| *H01L 27/24* | (2006.01) |

(52) U.S. Cl.
CPC ............ *H01L 45/146* (2013.01); *H01L 45/085* (2013.01); *H01L 45/10* (2013.01); *H01L 45/1233* (2013.01); *H01L 45/1253* (2013.01); *H01L 45/145* (2013.01); *H01L 45/1616* (2013.01); *H01L 45/1641* (2013.01); *H01L 27/2409* (2013.01); *H01L 27/2481* (2013.01)

(58) Field of Classification Search
CPC ... H01L 45/145; H01L 45/146; H01L 45/085; H01L 45/10; H01L 45/1616; H01L 45/1641; H01L 45/2353
USPC ........................ 257/2, 3, 4, 350, 512, E45.002, 257/E45.003, E47.001, E21.008, E21.476; 365/148, 149, 163; 438/95, 104, 133, 438/385
See application file for complete search history.

(56) References Cited

U.S. PATENT DOCUMENTS

| | | | |
|---|---|---|---|
| 7,960,216 B2 * | 6/2011 | Phatak ......................... | 438/133 |
| 8,648,418 B2 * | 2/2014 | Miller et al. .................. | 257/350 |
| 2009/0227067 A1 * | 9/2009 | Kumar et al. ................. | 438/104 |
| 2013/0119343 A1 * | 5/2013 | Lee et al. .......................... | 257/4 |

* cited by examiner

Primary Examiner — Dao H Nguyen

(57) ABSTRACT

Resistive-switching memory elements having improved switching characteristics are described, including a memory element having a first electrode and a second electrode, a switching layer between the first electrode and the second electrode comprising hafnium oxide and having a first thickness, and a coupling layer between the switching layer and the second electrode, the coupling layer comprising a material including metal titanium and having a second thickness that is less than 25 percent of the first thickness.

19 Claims, 7 Drawing Sheets

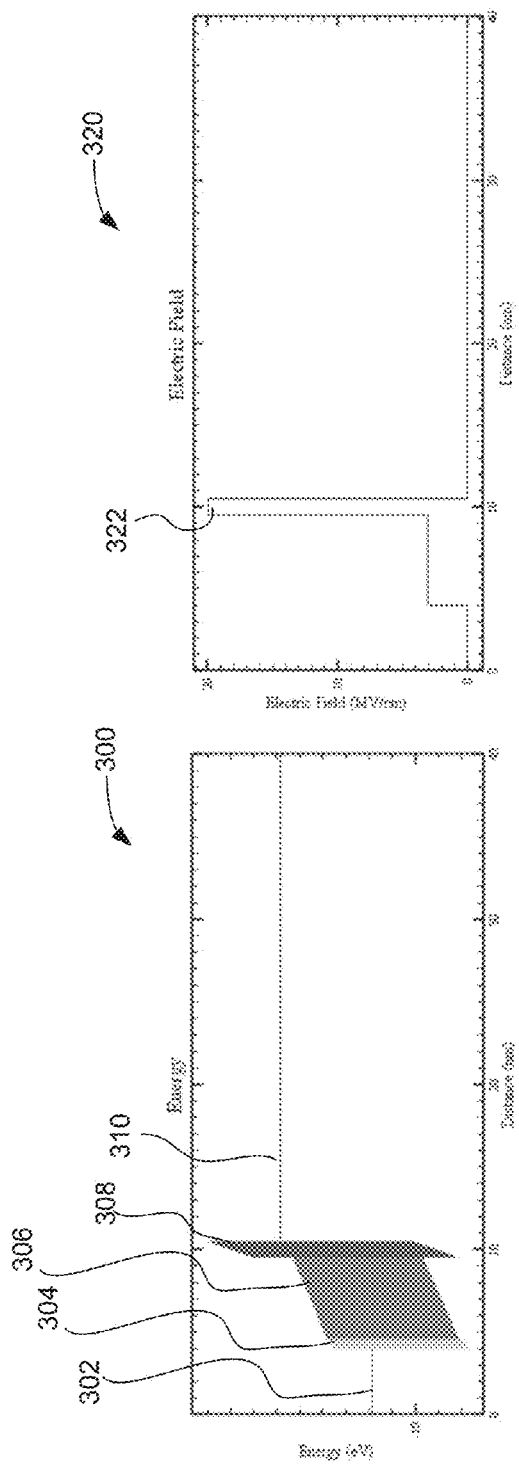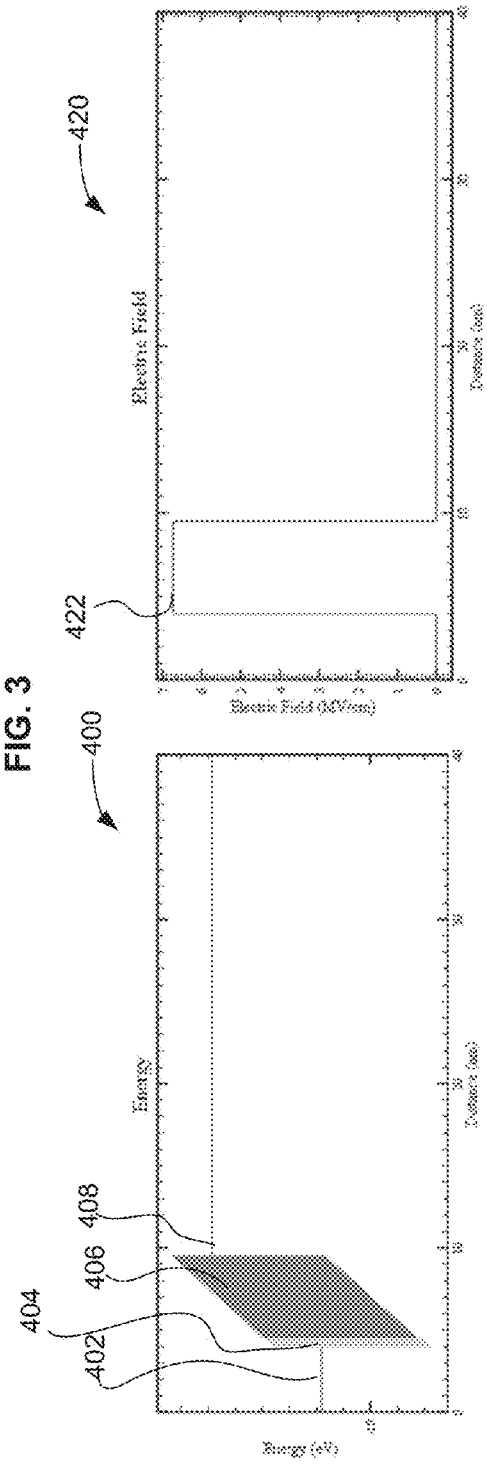
FIG. 3
FIG. 4

RESISTIVE-SWITCHING MEMORY ELEMENTS HAVING IMPROVED SWITCHING CHARACTERISTICS

CROSS-REFERENCE TO RELATED APPLICATIONS

This application is a continuation application and claims the benefit of U.S. patent application Ser. No. 14/255,749, filed Apr. 17, 2014, which is a continuation application and claims the benefit of U.S. patent application Ser. No. 13/656,908, filed Oct. 22, 2012, now U.S. Pat. No. 8,723,156, which is a continuation application of U.S. patent application Ser. No. 12/705,474, filed Feb. 12, 2010, now U.S. Pat. No. 8,343,813, which is a continuation-in-part of U.S. patent application Ser. No. 12/608,934 filed Oct. 29, 2009, now U.S. Pat. No. 8,183,553, which claims priority to U.S. Provisional Application No. 61/168,534, filed on Apr. 10, 2009, each of which is incorporated herein by reference for all purposes.

FIELD OF THE INVENTION

The present invention relates generally to semiconductor memories. More specifically, resistive-switching memory elements having improved switching characteristics are described.

BACKGROUND OF THE INVENTION

Non-volatile memories are semiconductor memories that retain their contents when unpowered. Non-volatile memories are used for storage in electronic devices such as digital cameras, cellular telephones, and music players, as well as in general computer systems, embedded systems and other electronic devices that require persistent storage. Non-volatile semiconductor memories can take the form of removable and portable memory cards or other memory modules, can be integrated into other types of circuits or devices, or can take any other desired form. Non-volatile semiconductor memories are becoming more prevalent because of their advantages of having small size and persistence, having no moving parts, and requiring little power to operate.

Flash memory is a common type of non-volatile memory used in a variety of devices. Flash memory uses an architecture that can result in long access, erase, and write times. The operational speeds of electronic devices and storage demands of users are rapidly increasing. Flash memory is proving, in many instances, to be inadequate for non-volatile memory needs. Additionally, volatile memories (such as random access memory (RAM)) can potentially be replaced by non-volatile memories if the speeds of non-volatile memories are increased to meet the requirements for RAM and other applications currently using volatile memories.

Resistive-switching memories are memories that include a resistive-switching material (e.g. a metal oxide) that changes from a first resistivity to a second resistivity upon the application of a set voltage, and from the second resistivity back to the first resistivity upon the application of a reset voltage. Existing resistive-switching memories have switching characteristics (e.g. set, reset, and forming voltages, retention) that are unsuitable for some applications.

Thus, what is needed is a resistive-switching memory element with improved switching characteristics.

BRIEF DESCRIPTION OF THE DRAWINGS

Various embodiments of the invention are disclosed in the following detailed description and the accompanying drawings:

FIGS. 3 and 4 are band diagrams and that illustrate energy levels in a memory element with (FIG. 3) and without (FIG. 4) an interface layer;

DETAILED DESCRIPTION

Figure 1:
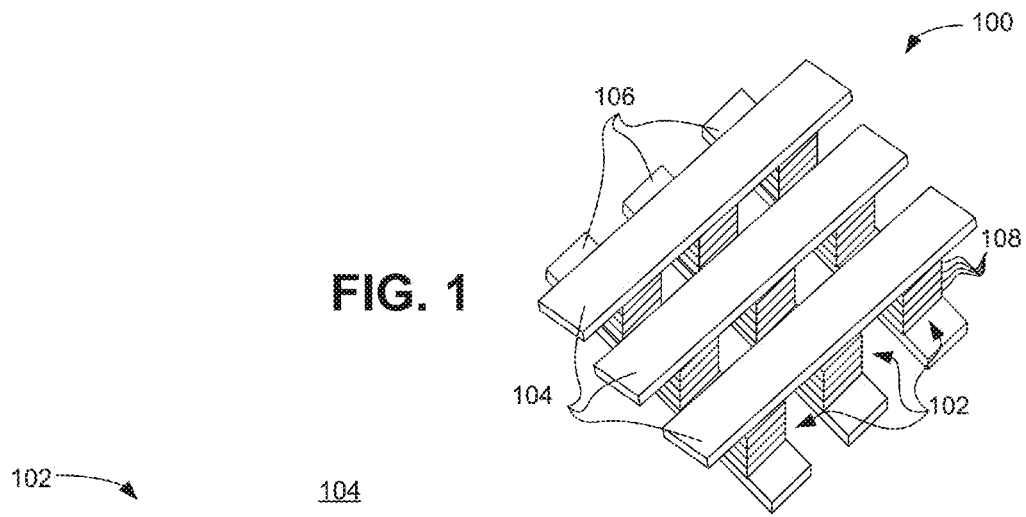
FIG. 1 illustrates a memory array of resistive switching memory elements.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, resistive-switching memory elements are described herein. The memory elements generally have a metal-insulator-metal (MIM) structure in which resistive-switching insulating layers are surrounded by two conductive electrodes. Some embodiments described herein are memory elements that include electrodes of different materials (e.g. one electrode is doped silicon and one is titanium nitride) surrounding a resistive-switching layer of a metal oxide (e.g. hafnium oxide ($HfO_2$), thickness ~20-100 Å) and a coupling layer that is substantially thinner than the resistive-switching layer (e.g. less than 25% the thickness of the resistive-switching layer). In some embodiments, the coupling layer can be a metallic material such as titanium. Memory elements including the coupling layer have exhibited improved switching characteristics (e.g. lower set, reset, and forming voltages, and better retention). In some embodiments, the resistive-switching layer includes a higher bandgap material (i.e. a material having a bandgap greater than 4 eV such as HfOx, AlOx, TaOx, YOx, ZrOx, CeOx, etc.), however other resistive-switching layers may include materials having a bandgap less than 4 eV (e.g. TiOx).

In other embodiments, a metal-rich metal oxide switching layer and techniques for forming the metal-rich switching layer are described. The metal-rich switching layer includes increased numbers of defects (e.g. oxygen vacancies), which can be manipulated to improve switching characteristics. The metal-rich switching layer can be deposited, for example, by reducing the degree of oxidation that is occurs in an atomic layer deposition (ALD) or plasma-enhanced ALD (PEALD) process. In another embodiment, the coupling layer is a metallic layer (e.g. metallic titanium) that, when the memory is annealed, attracts oxygen from the adjacent metal oxide switching layer. This results in an at least partially oxidized coupling layer (e.g. the coupling layer becomes at least partially titanium oxide) and a switching layer that is metal rich. In further embodiments, techniques for removing or controlling the size of an interface layer between an electrode and a switching layer deposited thereon are described.

I. Switching Operation

It is believed that the resistive switching of the memory elements described herein is caused by defects in a metal oxide switching layer of the memory element. Generally, defects are formed in or already exist in the deposited metal oxide, and existing defects can be enhanced by additional processes. For example, physical vapor deposition (PVD) processes and atomic layer deposition (ALD) processes deposit layers that can have some imperfections or flaws. Defects may take the form of variances in charge in the structure of the metal oxide: some charge carriers may be absent from the structure (i.e. vacancies), additional charge carriers may be present (i.e. interstitials), or one element can substitute for another (i.e. substitutional).

The defects are thought to be electrically active defects (also known as traps) in the bulk of the metal oxide and/or at the interface of the metal oxide and adjoining layers. It is believed that the traps can be filled by the application of a set voltage (to switch from a high to a low resistance state), and emptied by applying a reset voltage (to switch from the low to the high resistance state). Traps can be inherent in the as-deposited metal oxide (i.e., existing from formation of the metal oxide) or created and/or enhanced by doping and other processes. Doping can be performed using adjacent "doping" layers that interdiffuse with the switching layer, using implantation, or using other techniques.

It is believed that the defects in the switching layer form conductive percolation paths upon the application of the set voltage. It is further believed that the percolation paths are removed upon the application of a reset voltage. For example, a hafnium oxide layer may include oxygen or hafnium vacancies or oxygen or hafnium interstitials that may form traps which can be used to create percolation paths and alter the conductivity of the hafnium oxide layer.

The switching characteristics of the resistive-switching memory elements can be tailored by controlling the defects within the metal oxides. Switching characteristics include operating voltages (e.g. set, reset, and forming voltages), operating currents (e.g. on and off currents), and data retention. Defect control is achieved by type, density, energy level, and spatial distribution within the switching layer. These defects then modulate the current flow based on whether they are filled (passivated/compensated) or unfilled (uncompensated). Adding different layers, controlling the formation of the switching layer, implanting, controlling stress, certain thermal treatments are all used to control the defect characteristics. In addition, the defects need not be mobile. For example, a coupling layer 212 (see FIG. 2A) and an interface layer 214 (see FIGS. 2A and 8A-8B) can be used to control locations, depths, densities, and/or type of defects, and techniques can be used to form a switching layer having an increased number of defects.

Additionally, the switching layer can have any phase (e.g., crystalline and amorphous) or mixtures of multiple phases. Amorphous-phase metal oxides may have increased resistivity, which in some embodiments can lower the operational currents of the device to reduce potential damage to the memory element.

II. Memory Structure

A. Memory Array

FIG. 1 illustrates a memory array 100 of resistive switching memory elements 102. Memory array 100 may be part of a memory device or other integrated circuit. Memory array 100 is an example of potential memory configurations; it is understood that several other configurations are possible.

Read and write circuitry may be connected to memory elements 102 using signal lines 104 and orthogonal signal lines 106. Signal lines such as signal lines 104 and signal lines 106 are sometimes referred to as word lines and bit lines and are used to read and write data into the elements 102 of array 100. Individual memory elements 102 or groups of memory elements 102 can be addressed using appropriate sets of signal lines 104 and 106. Memory element 102 may be formed from one or more layers 108 of materials, as is described in further detail below. In addition, the memory elements 102 shown can be stacked in a vertical fashion to make multi-layer 3-D memory arrays (see FIG. 7).

Any suitable read and write circuitry and array layout scheme may be used to construct a non-volatile memory device from resistive switching memory elements such as element 102. For example, horizontal and vertical lines 104 and 106 may be connected directly to the terminals of resistive switching memory elements 102. This is merely illustrative.

Figure 2A:
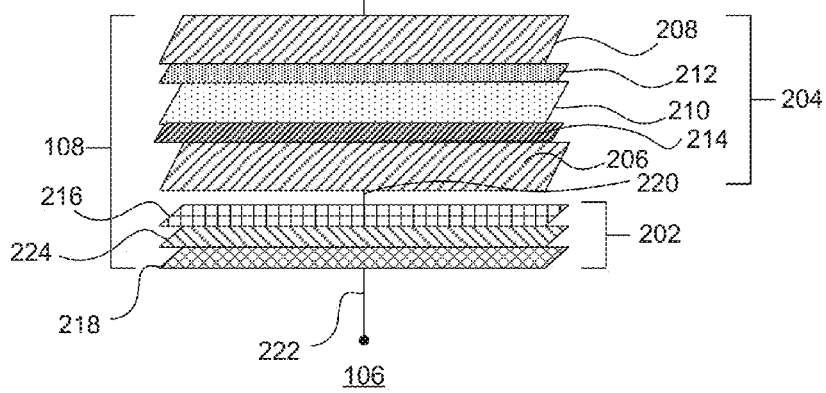
FIGS. 2A and 2B illustrate a memory element including a resistive-switching material and a select element.

If desired, other electrical devices may be associated (i.e., be one or more of the layers 108) with each memory element 102 (see, e.g., FIG. 2A). These devices, which are sometimes referred to as select elements, may include, for example, diodes, p-i-n diodes, silicon diodes, silicon p-i-n diodes, transistors, Schottky diodes, etc. Select elements may be connected in series in any suitable locations in memory element 102.

B. Memory Element

1. MIM Structure

Figure 2B:
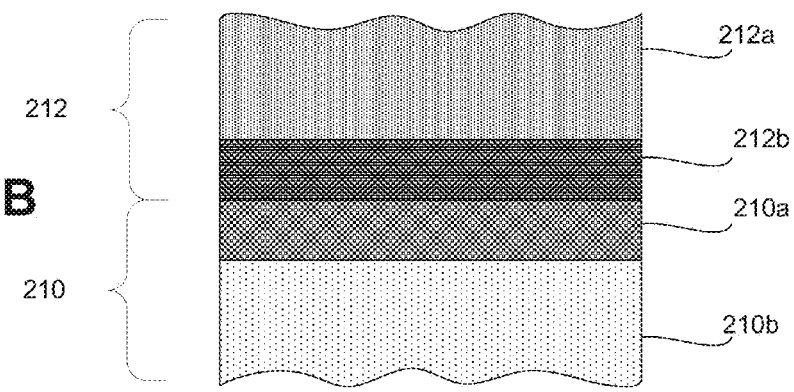

FIGS. 2A and 2B illustrate a memory element 102 including a resistive-switching material and a select element (a diode 202). FIG. 2B is an enlarged view of a portion of the memory element 102 according to one embodiment. The memory element 102 includes a metal-insulator-metal (MIM)-style stack 204 (in some embodiments, one or more of the metal layers can be a conductive semiconductor material such as doped silicon). The stack 204 includes two electrodes 206 and 208 and a resistive-switching layer 210 (e.g. an insulator or metal oxide). The electrodes 206 and 208 can be metals, metal carbides, metal oxides, or metal nitrides (e.g. Pt, Ru, $RuO_2$, Ir, $IrO_2$, TiN, W, TaN, MoN, MoOx, WN, TiAl alloys, Ni, WOx, Al, doped Al, Cu, HfC, HfN, NbN, TaC, TaSiN, Ti, VC, VN, ZrN, etc.), or can be doped silicon, for example p- or n-type doped polysilicon. The resistive-switching layer 210 can be a metal oxide or other switching material. In some embodiments, the resistive-switching layer 210 is a high bandgap (i.e. bandgap greater than four electron volts (eVs)) material such as $HfO_2$, $Ta_2O_5$, $Al_2O_3$, $Y_2O_3$, $CeO_2$ and $ZrO_2$. In other embodiments, lower bandgap metal oxide materials can be used, such as or $TiO_2$. $CeO_2$ may be advantageous for some embodiments because it may include ions that have higher mobility. In further embodiments, a semiconductive metal oxide (p-type or n-type) such as ZnO, CuO, and their nonstoichiometric and doped variants can be used because it is believed that these oxides may have advantageous switching characteristics.

a. Switching Layer

The switching layer 210 can have any desired thickness, but in some embodiments can be between 10 and 1001, between 20 and 60 Å, or approximately 50 Å. The switching layer 210 can be deposited using any desired technique, but in some embodiments described herein is deposited using ALD. In other embodiments, the switching layer 210 can be deposited using low pressure CVD (LPCVD), plasma enhanced CVD (PECVD), plasma enhanced ALD (PEALD), physical vapor deposition (PVD), liquid deposition processes, and epitaxy processes. It is believed that PEALD processes can be used to control defects and improve switching and forming voltages in some embodiments.

The switching layer 210 additionally can be metal-rich (e.g. $HfO_{1.7}$ vs. $HfO_2$) such that the elemental composition of the switching layer 210 is less than stoichiometric (e.g. less than $HfO_2$). The switching layer 210 can have a deficit of oxygen, which manifests as oxygen vacancy defects. The additional defects can lead to reduced and more predictable switching and forming voltages of the memory element 102. Techniques for depositing a metal-rich switching layer 210 are described in FIG. 11.

In some embodiments, higher bandgap (i.e. greater than 4 eV) metal oxides have set voltages that increase with increased thickness (i.e. are scalable), which indicates a bulk-switching property and which may be desirable for the ability to alter operating voltages based on layer thickness. Examples of these materials include those shown in Table 1. In other embodiments, ternary metal oxides, such as $Hf_xM_yO_z$, where M=Al, Zr, Ti, La, or Sr can also be used for the switching layer 210.

TABLE 1

| Material | Bandgap |
|---|---|
| HfO2 | 5.7 eV |
| Al2O3 | 8.4 eV |
| Ta2O5 | 4.6 eV |
| Y2O3 | 6.0 eV |
| ZrO2 | 5.8 eV |
| CeO2 | 5.5 eV | b. Coupling Layer

The stack 204 can also include a coupling layer 212, which may be another metal oxide such as $ZrO_2$ or $Al_2O_3$, or a metallic layer, such as metallic Ti. In other embodiments, the coupling layer 212 can be deposited as a metal layer that will partially or fully oxidize upon the deposition of the adjacent electrode 208 or upon annealing. The coupling layer 212 can, for example, facilitate switching at the electrode 208 by creating defects near the electrode 208. For example, if the coupling layer is a metal such as Ti, during an anneal (such as rapid thermal oxidation or a vacuum anneal), the coupling layer 212 can attract oxygen from the adjacent metal oxide switching layer 210, thereby creating oxygen vacancies in the switching layer 210 while oxidizing the coupling layer 212.

For example, as shown in FIG. 2B, a memory element 102 includes a coupling layer 212 that is substantially metallic titanium (or another metal) as deposited, and a switching layer that is a metal oxide (e.g. $HfO_2$). After the memory element 102 is annealed or as a result of the deposition of the electrode 208, the metallic coupling layer 212 can attract oxygen from the switching layer 210, resulting in the coupling layer 212 and switching layer 210 having multiple portions having different characteristics (e.g. different oxygen concentrations). For example, a first portion 212a of the coupling layer 212 is substantially metallic (e.g. substantially metallic titanium), while a second portion 212b that is in contact with the switching layer 210 is substantially metal oxide (e.g. titanium oxide). At the same time, a first portion 210a of the switching layer 210 that is in contact with the coupling layer 210 is oxygen deficient because the oxygen in the metal oxide has migrated to the second portion 212b of the coupling layer 212, leaving oxygen vacancies which can be used to tailor switching characteristics. A second portion 210b of the switching layer 210 has an oxygen concentration that is greater than that of the first portion 210b. In other words, the first portion 210a is more metal rich (e.g. $HfO_{1.2-1.5}$) than the second portion (e.g. $HfO_{1.6-2.0}$). It is understood that the portions 210a, 210b, 212a, and 212b are merely illustrative, and that each of the switching layer 210 and the coupling layer 212 may have several portions having different concentrations of oxygen, or that the oxygen concentration may be gradated through the thickness of the layers 210 and 212. Further, the amount of oxidation of the coupling layer 212 and the reduction of oxygen of the switching layer 210 can be tailored by changing the parameters (e.g. duration, oxygen concentration for RTO) of the anneal.

The coupling layer 212 can be thinner than the resistive-switching layer 210, for example the coupling layer 212 can have a thickness that is less than 25% of the thickness of the resistive-switching layer 210, or a thickness that is less than 10% of the thickness of the resistive-switching layer 210. For example, the resistive-switching layer 210 can be a 20-60 Å layer, and the interface layer 212 can be a 5-10 Å layer. The coupling layer 212 is thin enough to provide access to defects in the switching layer 210.

In some embodiments, the coupling layer 212 is metallic titanium as deposited, which in some embodiments can become at least partially titanium oxide during an anneal. A titanium coupling layer 212 can change the effective work function of the adjacent electrode 208, which can be used to modify switching characteristics (e.g. by reducing leakage).

c. Interface Layer

The stack 204 further may include an interface layer 214 between the electrode 206 and the switching layer 210. The interface layer 214 can be an oxide of the material of the electrode 206 that is formed as a result of and during the deposition of the switching layer 210, for example as a result of thermal oxidation during processing. The interface layer 214 can, in some embodiments, alter defects in the switching layer 210 (see, e.g. FIGS. 8A-8B). In other embodiments, it may be desirable to eliminate the interface layer 214 to reduce forming voltage or to enable switching. It is believed that in some embodiments, the interface layer 214 can hinder effective electron injection into the switching layer 210 that enables traps to be filled, which thereby increases forming voltage or causes excessive potential drop across the switching layer 210, producing high electric fields in the switching layer 210 and preventing switching. Techniques for controlling the size of or eliminating the interface layer 214 are described in FIGS. 11 and 12.

FIGS. 3 and 4 are band diagrams 300 and 400 that illustrate energy levels in a memory element with (FIG. 3) and without (FIG. 4) an interface layer 214. For each of the band diagrams 300 and 400, there are corresponding electric field diagrams 320 and 340 that illustrate the strength of the electric field within a certain region of the memory element 102.

In the band diagram 300, a memory element has a titanium nitride electrode 302, a zirconium oxide coupling layer 304, a hafnium oxide switching layer 306, a silicon oxide interface layer 308, and an n-type polysilicon electrode 310. The materials used here are illustrations; it is understood that other materials can also be used (e.g. metallic titanium instead of zirconium oxide). In the band diagram 400, a memory element has a titanium nitride electrode 402, a zirconium oxide coupling layer 404, a hafnium oxide switching layer 406, and an n-type polysilicon electrode 408. As is shown in the electric field diagram 320, the electric field is reduced by a large amount 322 in the interface layer 314. Increased switching voltages may be necessary to overcome the electric field reduction in the interface layer 214. If the interface layer 214 is thick enough, the entire electric field may be lost to the interface layer 214, which may prevent switching altogether. Alternatively, as is shown in the electric field diagram 420, in the memory element without the interface layer 214 the electric field is reduced evenly 422 throughout the memory element 102, including in the switching layer 210, which can reduce switching voltages and lead to more predictable switching. However, as is described regarding FIGS. 8A and 8B, it may be desirable to retain a controlled-thickness interface layer 214 to increase the number of defects in the switching layer 210.

Figure 5:
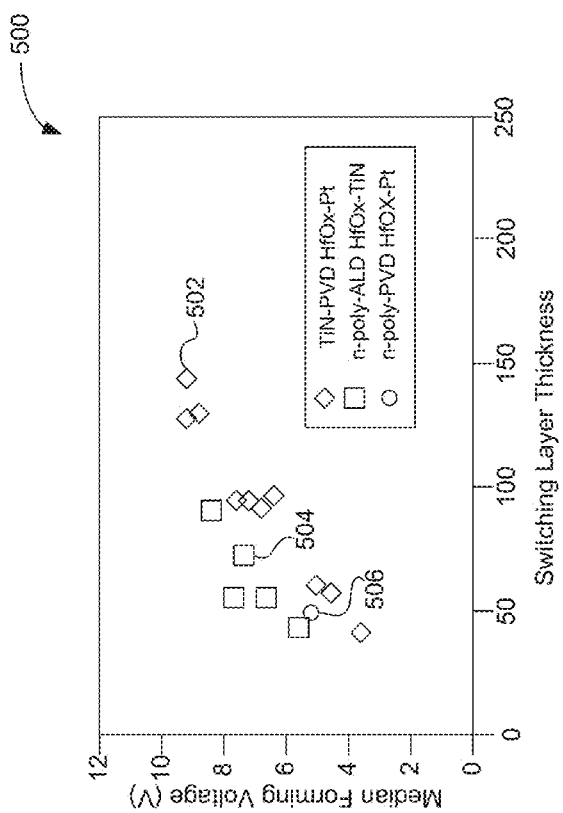
FIG. 5 is a graph illustrating the dependency of forming voltage on the presence of an interface layer.

FIG. 5 is a graph 500 illustrating the dependency of forming voltage on the presence of an interface layer 214. Three sets of memory elements were prepared:

A first set of memory elements represented by diamonds 502 includes a titanium nitride electrode 206, a PVD-deposited hafnium oxide switching layer 210, and a platinum electrode 208 without a coupling layer 212.

A second set of memory elements represented by squares 504 includes an n-type polysilicon electrode 206, an ALD-deposited hafnium oxide switching layer 210, and a titanium nitride electrode 208 without a coupling layer 212.

A third set of memory elements represented by a circle 506 includes an n-type polysilicon electrode 206, a PVD-deposited hafnium oxide switching layer 210, and a platinum electrode 208 without a coupling layer 212.

The graph 500 shows the median forming voltage of the memory elements as a function of the thickness of the switching layer in the memory elements. As can be seen, for a switching layer having the same thickness, the elements 502 including PVD hafnium oxide on titanium nitride have the lowest forming voltage, elements 506 including PVD hafnium oxide on polysilicon have the next lowest forming voltage, and elements 504 having ALD hafnium oxide on polysilicon have the highest forming voltage. It is believed that ALD processes are more likely to form a thicker interface layer 214 at least partly because of potentially higher processing temperatures (200° C. or greater versus room temperature for some instances of PVD), which leads to increased forming voltages. Additionally, the silicon oxide interface layer 214 created on polysilicon electrodes (e.g. the elements 502 and 506) is less conductive than an oxide created on a metal-containing electrode such as titanium nitride. Therefore, techniques for reducing and/or controlling the interface layer 214, especially for silicon-based electrodes, can be used to improve forming voltages.

Figure 11:
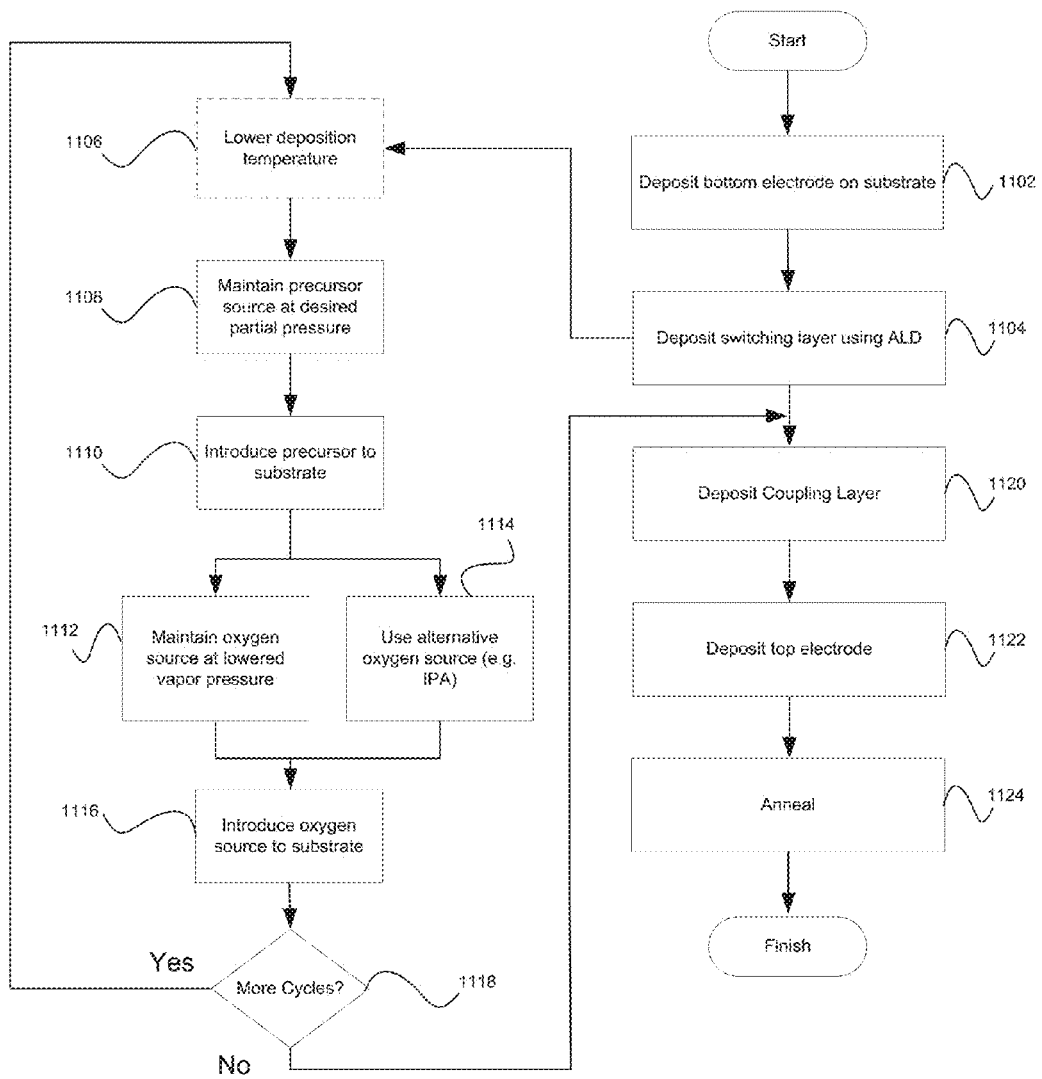
FIG. 11 is a flowchart describing a process for controlling the formation of interface layers.

Although ALD process may be more likely to form thicker interface layers 214 and result in memory elements having increased forming voltages, it may be desirable to use ALD processing over PVD processing for other reasons (e.g. to form more conformal layers), and FIG. 11 describes a process for reducing or eliminating the interface layer 214 using ALD processing. Additionally, as is described regarding FIGS. 8A and 8B, it may be desirable to retain a controlled-thickness interface layer 214 (e.g. less than or equal to 10 Å) to increase the number of defects in the switching layer 210, which can also be formed using the process of FIG. 11.

If it is desirable to have an interface layer 214, the order of deposition of the layers of the MIM stack 204 may be important. Since the interface layer 214 is formed during the deposition of the switching layer 210, the switching layer 210 can be formed on the electrode that the interface layer 214 is to be formed from (e.g. formed on the polysilicon layer if a silicon oxide interface layer 214 is desired). As an example, and as is discussed further in FIG. 7, when forming a three-dimensional memory array, it may be necessary to always form the memory element in the same orientation (e.g. one electrode always on the bottom), even when the orientation of other elements is to be reversed. In other embodiments however, the interface layer 214 can be created when the memory element 102 is deposited in reverse order by using a post deposition anneal of the memory element 102.

d. Electrodes

The electrodes 206 and 208 can be different materials. In some embodiments, the electrodes have a work function that differs by between 0.1 and 1 electron volt (eV), or by between 0.4 and 0.6 eV, etc. For example, the electrode 208 can be TiN, which has a work function of 4.5-4.6 eV, while the electrode 206 can be n-type polysilicon, which has a work function of approximately 4.1-4.15 eV. Other electrode materials include p-type polysilicon (4.9-5.3 eV), transition metals, transition metal alloys, transition metal nitrides, transition metal carbides, tungsten (4.5-4.6 eV), tantalum nitride (4.7-4.8 eV), molybdenum oxide (approximately 5.1 eV), molybdenum nitride (4.0-5.0 eV), iridium (4.6-5.3 eV), iridium oxide (approximately 4.2 eV), ruthenium (approximately 4.7 eV), and ruthenium oxide (approximately 5.0 eV). Other potential electrodes include a titanium/aluminum alloy (4.1-4.3 eV), nickel (approximately 5.0 eV), tungsten nitride (approximately 4.3-5.0 eV), tungsten oxide (5.5-5.7 eV), aluminum (4.2-4.3 eV), copper or silicon-doped aluminum (4.1-4.4 eV), copper (approximately 4.5 eV), hafnium carbide (4.8-4.9 eV), hafnium nitride (4.7-4.8 eV), niobium nitride (approximately 4.95 eV), tantalum carbide (approximately 5.1 eV), tantalum silicon nitride (approximately 4.4 eV), titanium (4.1-4.4 eV), vanadium carbide (approximately 5.15 eV), vanadium nitride (approximately 5.15 eV), and zirconium nitride (approximately 4.6 eV). For some embodiments described herein, the higher work function electrode receives a positive pulse (as measured compared to a common reference potential) during a reset operation, although other configurations are possible. In other embodiments, the higher work function electrode receives a negative pulse during a reset operation. In some embodiments, the memory elements 102 use bipolar switching where the set and reset voltages have opposite polarities relative to a common electrical reference, and in some embodiments the memory elements 102 use unipolar switching where the set and reset voltages have the same polarity. In other embodiments, it is desirable to generally increase the work function of the electrodes in order to reduce leakage and create a more stable metal oxide/electrode interface.

2. Select Elements

The diode 202 is a select element that can be used to select a memory element for access from amongst several memory elements such as the several memory elements 102 of the memory array 100 (see FIG. 1). The diode 202 controls the flow of current so that current only flows one way through the memory elements 102.

The diode 202 may include two or more layers of semiconductor material. A diode is generally a p-n junction, and doped silicon layers 216 and 218 can form the p-n junction. For example, doped silicon layer 216 can be a p-type layer and doped silicon layer 218 can be an n-type layer, so that a node 220 of the diode 202 is an anode and is connected to the first electrode 206. In this example, a node 222 of the diode 202 is a cathode and is connected to the signal line 106, which may be, for example, a bit line or word line, or connected to a bit line or word line. The nodes 220 and 222 are not necessarily physical features in the memory element 102, for example the electrode 206 may be in direct contact with the doped silicon layer 216. In other embodiments, one or more additional layers such as a low resistivity film are added between the electrode 206 and the doped silicon layer 216.

In some embodiments, doped silicon layer 216 is an n-type layer and doped silicon layer 218 is a p-type layer, and the node 220 is a cathode of the diode 202 and the node 222 is an anode of the diode 202. An optional insulating layer 224 can be between the doped silicon layers 216 and 218 to create a p-i-n or n-i-p diode 202. In some embodiments the insulating layer 224 and one of the doped silicon layers 216 and 218 are formed from the same layer. For example, a silicon layer can be deposited, and a portion of the layer can be doped to form the doped silicon layer 216 or 218. The remaining portion of the layer is then the insulating layer 224.

Figure 6:
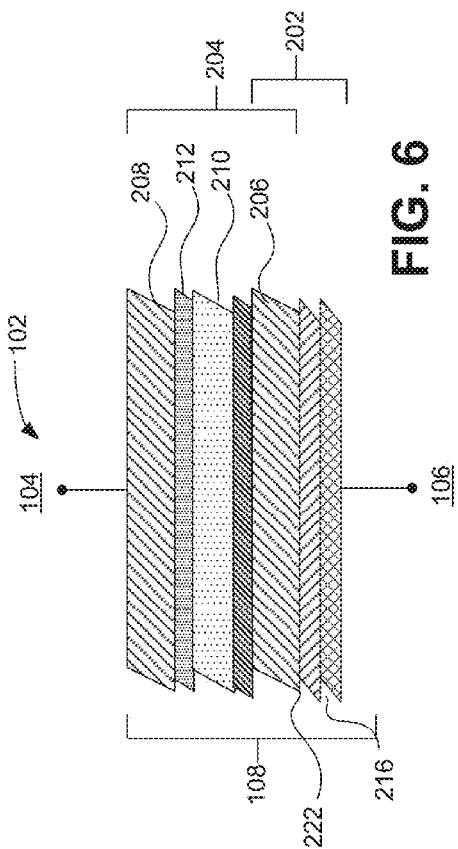
FIG. 6 illustrates a memory element that shares an electrode with a diode that is used as a select element.

In other embodiments, one electrode of the memory element 102 can be doped silicon (e.g. p-type or n-type polysilicon), which can also act as a portion of the diode 202. FIG. 6 illustrates a memory element 102 that shares an electrode with a diode 202 that is used as a select element. Since the diode 202 is made up of two layers of doped silicon, and since a layer of doped silicon can be used as an electrode of the memory element 202, a single layer of doped silicon (e.g. a layer of n-type polysilicon) can serve as an electrode of the memory element 102 and as a layer of the diode 202. By sharing a doped silicon layer between the diode 202 and the memory element 102, two layers, one doped silicon layer and a coupling layer between the diode 202 and the memory element 102, and their associated processing steps, can be eliminated.

3. Switching Polarity

A signal line (e.g. the signal line 104) is connected to the "second" electrode 208, and the signal line is configured to provide switching voltages to the second electrode 208. In some embodiments, the second electrode 208 has a higher work function than the first electrode 206, and the signal line 104 is configured to provide a negative set voltage relative to a common electrical reference, and a positive reset voltage relative to the common electrical reference. The embodiments may include those using a lower work function first electrode 206 (e.g. titanium nitride) and a higher work function second electrode such as platinum or ruthenium. For example, the common electrical reference may be ground (i.e. 0V), the set voltage would then be a negative voltage (e.g. −2V), and the reset voltage would be a positive voltage (e.g. 2V). The common electrical reference can be any voltage, however, such as +2V or −2V.

In other embodiments, the second electrode 208 also has a higher work function than the first electrode 206, and the signal line 104 is configured to provide a positive set voltage and a negative reset voltage relative to a common electrical reference. For example, in a memory element having a doped silicon first electrode 206 (e.g. n-type polysilicon) and a higher work function second electrode 208 (e.g. titanium nitride), the reset voltage can be negative at the second electrode 208.

In some embodiments, one switching voltage (e.g. the reset voltage) of the memory element can have a first polarity (e.g. a positive polarity) relative to the common electrical reference, and the other switching voltage (e.g. the set voltage) can have a negative polarity relative to the common electrical reference so that the memory element uses bipolar switching. In other embodiments, the switching voltages have the same polarity relative to a common reference and are referred to as unipolar switching. In some embodiments, it may be desirable to use unipolar switching to provide compatibility with certain configurations of other elements of the memory array (e.g. select elements). Additionally, the switching voltages can be voltage pulses (e.g. square wave pulses) having a limited duration, for example less than 1 ms, less than 50 µs, less than 1 µs, less than 50 ns, etc.

In one embodiment, the switching layer 210 can be a metal alloy, such as a Ni/Ti alloy. It is believed that the types of bonds in the alloy (i.e. covalent v. ionic) can influence whether the switching is unipolar or bipolar. In other embodiments, the switching layer 210 can be p-type metal oxides, such as doped ZnO or doped CuO.

4. Other Characteristics

It may be desirable to have a low-leakage material as the resistive-switching layer 210 in order to aid memory retention. For example, the layer 210 may be a material that has a leakage current density less than 40 amps per square centimeter ($A/cm^2$) measured at 0.5 volts (V) per twenty angstroms of the thickness of the metal oxide in an off state (e.g. a high resistance state) of the memory element.

5. 3-D Memory Structure

Figure 7:
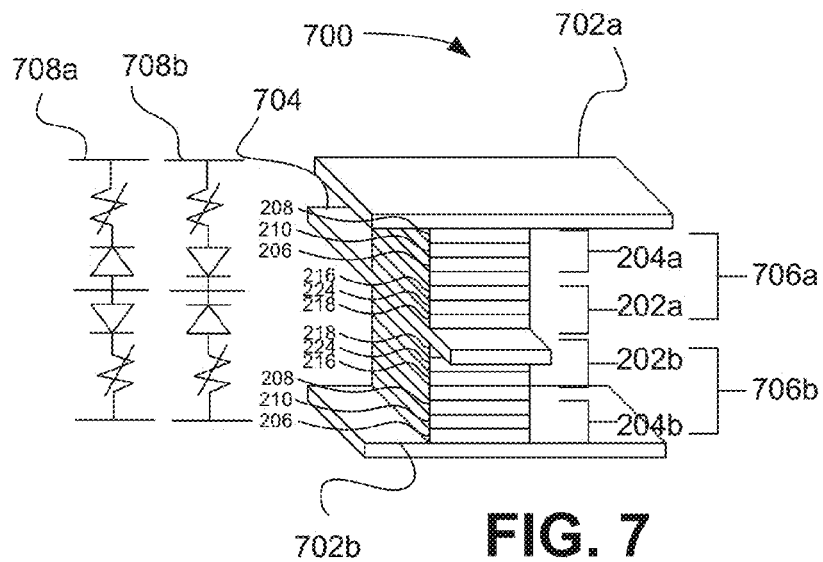
FIG. 7 illustrates a portion of a three-dimensional memory array using memory elements described herein.

FIG. 7 illustrates a portion of a three-dimensional memory 700 array using memory elements 102 described herein. The array 700 includes two word lines 702a and 702b, and a shared bit line 704. Two MIM stacks 204a and 204b and diodes 202a and 202b are shown in the array 700; a memory cell 706a includes an MIM stack 204a and a diode 202a, and a memory cell 706b includes an MIM stack 204b and a diode 202b.

The memory array 700 is configured so that the two memory cells 706a and 706b can use the same shared bit line 704. As shown here, the MIM stacks 204a and 204b both have their individual layers (i.e. electrodes 206 and 208 and switching layer 210) built in the same order. In other words, for both MIM stacks 204a and 204b, the electrode 206 is formed first, the switching layer 210 is formed on top of the electrode 206, and the electrode 208 is formed on top of the switching layer 210. As mentioned above, the order of deposition of the layers of the MIM stacks 204 may need to be the same in order to create an interface layer 214. However, in some embodiments the order of deposition can be reversed and the interface layer 214 created as a result of subsequent processes such as electrode deposition or annealing.

The diodes 202a and 202b, on the other hand, are mirrors of each other. In other words the diode 202a has the layer 216 on the bottom, and the diode 202b has the layer 218 on the bottom. For example, the layer 216 may be the n-type layer and the layer 218 may be the p-type layer. Using this configuration, the diodes 202a and 202b are biased in opposite directions, which allows the memory cells 706 to both use the same shared bit line 704. As is shown in circuit diagrams 708a and 708b, the diodes can have any desired orientation, and the orientation may differ based on the configuration of the three-dimensional memory array.

6. Interface Layer and Oxygen Vacancies

Figures 8A, 8B:
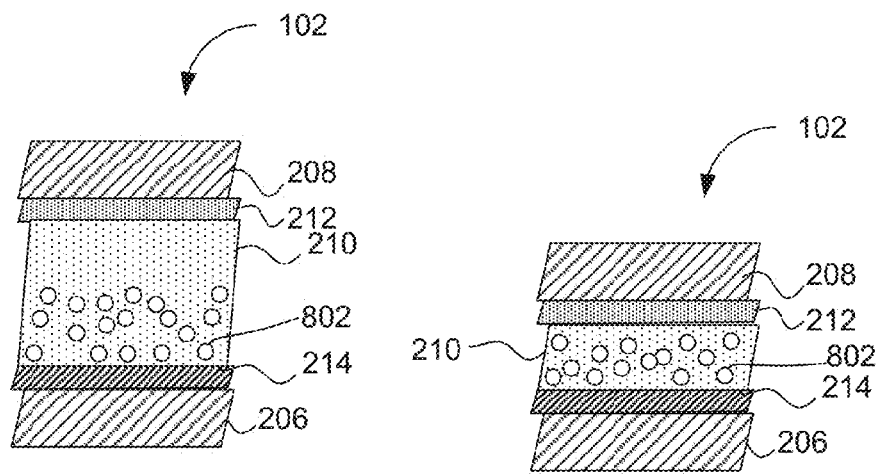
FIGS. 8A and 8B illustrate the memory element and the creation and manipulation of oxygen vacancies (defects) within the memory element using an interface layer.

FIGS. 8A and 8B illustrate the memory element 102 and the creation and manipulation of oxygen vacancies (defects) within the memory element 102 using an interface layer 214. The interface layer 214 is an oxide layer that can be created during the processing of other layers in the memory element 102. For example, the deposition of the switching layer 210 may include processing at a temperature (e.g. 200° C. or greater) to create the interface layer 214. If, for example, the electrode 206 is doped silicon (e.g. polysilicon), the deposition of the switching layer 210 (using, for example, PVD or ALD) may include temperatures that can create a silicon oxide interface layer 214. The interface layer 214 can be eliminated in some embodiments, but in other embodiments, the interface layer 214 can be retained to improve retention of the switching layer 210 by improving leakage characteristics and to modulate defects (e.g. oxygen vacancies) in the switching layer 210. In some embodiments where the interface layer 214 is retained, the interface layer 214 may be relatively thin (e.g. less than or equal to 10 Å) to make the defects in the switching layer 210 visible to the electrode 206 (i.e. the interface layer 214 provides access to the defects of the switching layer 210) and to reduce the effect of the interface layer 214 on switching voltages.

In one example, the bottom electrode 206 is polysilicon. Silicon, particularly, is known for attracting oxygen when heated and can draw oxygen from the metal oxide switching layer 210, leaving oxygen vacancies 802 in the switching layer 210 nearby creating a metal-rich metal oxide switching layer. Without being bound by theory, these oxygen vacancies 802 can serve as traps which modulate the current flow with the application of programming voltages to fill and empty such traps. The oxygen vacancies 802 need not be mobile. In some embodiments, the existence of an interface layer 214 can be combined with the existence of a metallic coupling layer 212 that also attracts oxygen, which can, depending on the processing conditions, create additional oxygen vacancies on both sides of the switching layer 210 or throughout the switching layer 210.

A thin or zero interlayer thickness interface layer 214 can be used to modulate the density of oxygen vacancies 802 in the switching layer 210. For example, a thinner interface layer 214 (e.g. 5 Å vs. 10 Å) can increase the oxygen vacancy 802 density. Additionally, the thickness of the switching layer 210 can be optimized such that traps (e.g. oxygen vacancies 802) are more spatially equalized throughout the switching layer 210. For example, FIG. 8A shows a thicker switching layer 210, which has oxygen vacancies 802 concentrated near the interface layer 214, while FIG. 8B shows a thinner switching layer 210 that has a more even distribution of oxygen vacancies 802. For example, in two memory elements using the same materials, the switching layer 210 of FIG. 8A may be 50 Å while the thickness of the switching layer 210 in FIG. 8B is 25 Å. The distribution of oxygen vacancies 802 within the switching layer 210 can depend on several factors, including the materials used, the thickness of the interface layer 214, the processes used (e.g. temperatures of anneals used), etc. FIGS. 8A and 8B are only two examples of oxygen vacancy distribution, and it is understood that various other configurations are possible.

III. Memory Operation

During a read operation, the state of a memory element 102 can be sensed by applying a sensing voltage (i.e., a "read" voltage $V_{READ}$) to an appropriate set of signal lines 104 and 106. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 104 and 106.

Figure 9:
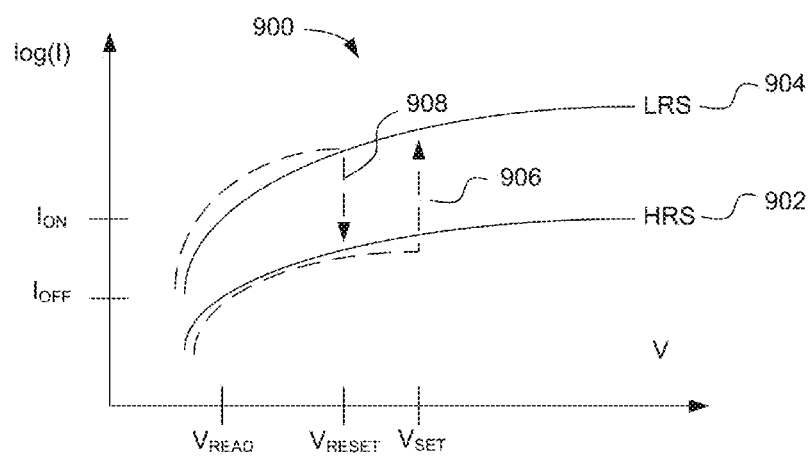
FIG. 9 is a logarithm of current (I) versus voltage (V) plot for a memory element.

FIG. 9 is a logarithm of current (I) versus voltage (V) plot 900 for a memory element 102. FIG. 9 illustrates the set and reset operations to change the contents of the memory element 102. Initially, memory element 102 may be in a high resistance state ("HRS", e.g., storing a logic zero). In this state, the current versus voltage characteristic of memory element 102 is represented by solid line HRS 902. The high resistance state of memory element 102 can be sensed by read and write circuitry using signal lines 104 and 106. For example, read and write circuitry may apply a read voltage $V_{READ}$ to memory element 102 and can sense the resulting "off" current $I_{OFF}$ that flows through memory element 102. When it is desired to store a logic one in memory element 102, memory element 102 can be placed into its low-resistance state. This may be accomplished by using read and write circuitry to apply a set voltage $V_{SET}$ across signal lines 104 and 106. Applying $V_{SET}$ to memory element 102 causes memory element 102 to switch to its low resistance state, as indicated by dashed line 906. In this region, the memory element 102 is changed so that, following removal of the set voltage $V_{SET}$, memory element 102 is characterized by low resistance curve LRS 904. As is described further below, the change in the resistive state of memory element 102 may be because of the filling of traps (i.e., a may be "trap-mediated") in a metal oxide material. $V_{SET}$ and $V_{RESET}$ can be generally referred to as "switching voltages."

The low resistance state of memory element 102 can be sensed using read and write circuitry. When a read voltage $V_{READ}$ is applied to resistive switching memory element 102, read and write circuitry will sense the relatively high "on" current value $I_{ON}$, indicating that memory element 102 is in its low resistance state. When it is desired to store a logic zero in memory element 102, the memory element can once again be placed in its high resistance state by applying a reset voltage $V_{RESET}$ to memory element 102. When read and write circuitry applies $V_{RESET}$ to memory element 102, memory element 102 enters its high resistance state HRS, as indicated by dashed line 908. When the reset voltage $V_{RESET}$ is removed from memory element 102, memory element 102 will once again be characterized by high resistance line HRS 904. Voltage pulses can be used in the programming of the memory element 102. For example, a 1 ms, 10 µs, 5 µs, 500 ns, etc. square pulse can be used to switch the memory element 102; in some embodiments, it may be desirable to adjust the length of the pulse depending on the amount of time needed to switch the memory element 102.

A forming voltage $V_{FORM}$ is a voltage applied to the memory element 102 to ready the memory element 102 for use. Some memory elements described herein may need a forming event that includes the application of a voltage greater than or equal to the set voltage or reset voltage. Once the memory element 102 initially switches the set and reset voltages can be used to change the resistance state of the memory element 102.

The bistable resistance of resistive switching memory element 102 makes memory element 102 suitable for storing digital data. Because no changes take place in the stored data in the absence of application of the voltages $V_{SET}$ and $V_{RESET}$, memory formed from elements such as element 102 is non-volatile.

Figure 10:
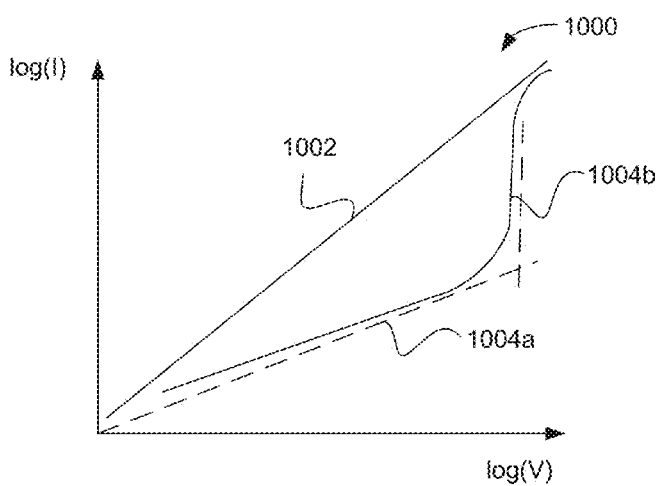
FIG. 10 is a current (I) versus voltage (V) plot for a memory element that demonstrates a resistance state change.

FIG. 10 is a current (I) versus voltage (V) plot 1000 for a memory element 102 that demonstrates a resistance state change. The plot 1000 shows a voltage ramp applied to the memory element 102 along the x-axis and the resulting current along a y-axis. The line 1002 represents the response of an Ohmic material when the ramped voltage is applied. An Ohmic response is undesirable, since there is no discrete voltage at which the set or reset occurs.

Generally, a more abrupt response like graph 1004 is desired. The graph 1004 begins with an Ohmic response 1004a, and then curves sharply upward 1004b. The graph 1004 may represent a set operation, where the memory element 102 switches from the HRS 902 to the LRS 904.

Without being bound by theory, non-metallic percolation paths are formed during a set operation and broken during a reset operation. For example, during a set operation, the memory element 102 switches to a low resistance state. The percolation paths that are formed by filling traps increase the conductivity of the metal oxide, thereby reducing (i.e., changing) the resistivity. The voltage represented by 404b is the set voltage. At the set voltage, the traps are filled and there is a large jump in current as the resistivity of the metal oxide decreases.

IV. Materials

A variety of metal oxides can be used for the switching layer 210 of the memory elements 102 described herein. In some embodiments, the memory elements 102 exhibit bulk-switching properties and are scalable. In other words, it is believed that defects are distributed throughout the bulk of the switching layer 210, and that the switching voltages (i.e. $V_{SET}$ and $V_{RESET}$) increase or decrease with increases or decreases in thickness of the metal oxide. In other embodiments, the memory elements 102 exhibit interface-mediated switching activity. Other embodiments may exhibit a combination of bulk- and interface-mediated switching properties, which may be scalable while still exhibiting defect activity at layer interfaces.

Table 1 includes a list of possible materials systems for memory elements 102 described herein. Although certain combinations are described in Table 1, various other configurations are possible within the bounds of the memory elements 102 described herein. For example, other electrode materials or switching materials can be used.

describes the deposition of a switching layer 210 using an ALD process that reduces the amount of oxygen introduced to create a metal-rich switching layer 210 and increase the amount of defects in the switching layer 210. Additionally, the process 1100 can be used to tailor the size of the interface layer 214 by selecting processing parameters to obtain a desired thickness of the interface layer 214.

Atomic layer deposition (ALD) is a process used to deposit conformal layers with atomic scale thickness control during various semiconductor processing operations. For depositing a metal oxide, ALD is a multi-step self-limiting process that includes the use of two reagents: a metal precursor and an oxygen source (e.g. an oxidant). Generally, a first reagent is introduced into a processing chamber containing a substrate and adsorbs on the surface of the substrate. Excess first reagent is purged and/or pumped away. A second reagent is then introduced into the chamber and reacts with the adsorbed layer to form a deposited layer via a deposition reaction. The deposition reaction is self-limiting in that the reaction terminates once the initially adsorbed layer is consumed by reaction with the second reagent. Excess second reagent is purged and/or pumped away. The aforementioned steps constitute one deposition or ALD "cycle." The process is repeated to form the next layer, with the number of cycles determining the total deposited film thickness.

Returning to FIG. 11, the process 1100 begins with depositing a bottom electrode on a substrate in operation 1102. The bottom electrode (e.g. the electrode 206) may be one of the electrode materials described above; however, in one embodiment, the bottom electrode is a polysilicon electrode that may form a silicon dioxide interface layer 214 during the deposition of the switching layer 210. In other embodiments, the bottom electrode is a metal electrode that can also oxidize during the deposition of the switching layer 210.

TABLE 1

| | Electrode 206 | Interface Layer 214 | Switching Layer 210 | Coupling Layer 212 | Electrode 208 |
|---|---|---|---|---|---|
| 1 | n-type polysilicon p-type polysilicon | 0-10 A SiOx | HfOx 30-100 A or ~50 A | TiOx (1-15 A or 5 A or 8 A), AlOx (1-15 A or 5 A or 8 A), ZrOx (1-15 A or 5 A or 8 A) or None | TiN, TaN, W, WN, Ni, Cu, Al, TiAl |
| 2 | n-type polysilicon p-type polysilicon | 0-10 A SiOx | HfxMyOz 30-100 A or ~50 A where M = Al, Zr, Ti, La, Sr | TiOx (1-15 A or 5 A or 8 A), AlOx (1-15 A or 5 A or 8 A), ZrOx (1-15 A or 5 A or 8 A) or None | TiN, TaN, W, WN, Ni, Cu, Al, TiAl |
| 3 | n-type polysilicon p-type polysilicon | 0-10 A SiOx | HfOx, CeOx, AlOx, TaOx, Yox, ZrOx, ZnOx, CuOx | Ti, TiOx or None | TiN, TaN, W, WN, Ni, Cu, Al, TiAl |
| 4 | TiN, TaN, W, WN, Ni, Cu, Al, TiAl | None | HfOx 30-100 A or ~50 A | Ti, TiOx or None | TiN, TaN, W, WN, Ni, Cu, Al, TiAl |
| 5 | TiN, TaN, W, WN, Ni, Cu, Al, TiAl | None | HfxMyOz 30-100 A or ~50 A where M = Al, Zr, Ti, La, Sr | Ti, TiOx or None | TiN, TaN, W, WN, Ni, Cu, Al, TiAl |
| 6 | TiN, TaN, W, WN, Ni, Cu, Al, TiAl | None | HfOx, CeOx, AlOx, TaOx, Yox, ZrOx, ZnOx, CuOx | Ti, TiOx or None | TiN, TaN, W, WN, Ni, Cu, Al, TiAl |

V. Processing

FIG. 11 is a flowchart describing a process 1100 for controlled deposition of an interface layer 214. The process 1100

In operation 1104, a switching layer 210 is deposited using ALD. The operation 1104 includes several component operations 1106-1118 that describe several cycles of the ALD process. Some of these operations are optional, or may be completed in a different order.

In operation 1106, the deposition temperature of the ALD process is optionally lowered. The deposition temperature may be lowered by lowering the temperature of a heated substrate pedestal (i.e. the pedestal temperature), for example. In some examples, the deposition temperature or pedestal temperature may be 250° C. or less, 200° C. or less, 175° C. or less, etc. Lower temperatures may change the equilibrium conversion of surface species during oxidation, altering the concentration of electrical defects in the switching layer 210. Additionally, the reduced deposition temperature can reduce or eliminate the interface layer 214 by reducing the rate of thermal oxidation. For example, when using a silicon electrode 206, reducing the ALD deposition temperature to below 200° C. may substantially reduce any interface layer 214.

In operation 1108, the precursor source is maintained at a desired pressure. The desired vapor pressure can be achieved by controlling the temperature of the precursor source. The precursor source is external to the ALD deposition chamber, and therefore can be maintained at a temperature different than the temperature of the deposition chamber. The desired temperature and pressure depends on the precursor used. For example, when using tetrakis(dimethylamino)hafnium (TDMAH) to deposit hafnium oxide, the precursor source can be maintained at 30-100° C., or 40-50° C. In some embodiments, the temperature of the precursor source can be increased to increase the partial pressure of the precursor, which can also create a more metal-rich switching layer by increasing the concentration of metal precursor in the chamber. In operation 1110, the precursor is introduced to the substrate including the bottom electrode to begin the ALD process.

Operations 1112 and 1114 describe the treatment of the oxygen source used to form the metal oxide. Depending on the characteristics of the memory element 102, either or both of operations 1112 and 1114 can be used to control the thickness of the interface layer 214. The oxygen source can be ozone, oxygen, water vapor, isopropyl alcohol (IPA), ethanol or another alcohol, or other ALD oxygen sources. For some configurations, using water vapor as an oxygen source in an ALD process has resulted in memory elements having improved switching characteristics.

In operation 1112, when the oxygen source is a liquid or solid such as water or isopropyl alcohol, it is maintained at a lower vapor pressure than is typical to create a switching layer 210 having less oxygen. The partial pressure of the oxidant can be reduced by reducing the source temperature which reduces its vapor pressure. The partial pressure can also be reduced by diluting the oxidant with an inert gas such as argon. Some oxidants such as oxygen and ozone are gases at their sources and therefore their partial pressure cannot be manipulated by changing the source temperature. A third method of reducing the degree of oxidation is through selection of the oxidant itself. For example, ozone and oxygen tend to be more oxidizing (i.e. more quickly create a layer having more oxygen), while water vapor is less oxidizing, and IPA and ethanol are less oxidizing still. Restricting the amount of the oxygen source in the chamber still allows the film to be self-limiting, while reducing the amount of oxygen in the film. Unreacted ligands attached to metal atoms can be partially or nearly fully removed through post-deposition treatments. The oxygen-deficient film will then have oxygen vacancies, which are defects that can be used to control the switching of the memory element 102.

To deposit a metal-rich hafnium oxide switching layer 210, for example, water vapor can be used as the oxygen source, and the water vapor source can be held at a reduced temperature such as 0 to 10° C. The reduced temperature reduces the vapor pressure of the oxygen source, effectively reducing the amount of oxidation per ALD cycle. Hafnium oxide films formed using this technique can result in elemental compositions of $HfO_{1.2}$ to $HfO_{1.9}$, or $HfO_{1.7}$. Generally, oxygen concentrations can be reduced to 60-95% of stoichiometric compositions (i.e. the amount of oxygen is between 60 and 95% of a stoichiometric metal oxide, e.g. $HfO_{1.2}$ to $HfO_{1.9}$). IPA or ethanol can be used to provide oxygen, but at the same temperature will provide less oxygen than water vapor or the other oxygen sources described above. IPA or ethanol may therefore be able to deposit metal-rich films using a room temperature source, although a similar temperature reduction can also be used with IPA and ethanol to reduce the amount of oxygen in the switching layer 210.

In operation 1116, the oxygen source is introduced to the substrate to create an ALD layer of metal oxide. A single ALD cycle may deposit a film having a thickness of 0.5 Å, for example, and multiple cycles are typically needed to build a switching layer 210 of the desired thickness. In operation 1118, if more cycles are needed, the process 1100 returns to operation 1106. If no more cycles are needed, the process 1100 continues to operation 1120.

In operation 1120, a coupling layer is deposited. The coupling layer 212 can be a thin layer, for example less than 25 percent the thickness of the switching layer. The coupling layer 212 can be deposited using any deposition method, such as ALD, PVD, etc. In operation 1122, the top electrode (e.g. the electrode 208) is deposited.

In operation 1124, the memory element is annealed. The annealing can remove unreacted precursor ligands that may exist in the film because of the low deposition temperature of the ALD process. In one example, the element is annealed using a hydrogen/argon mixture (e.g. 2-10% hydrogen, 90-98% argon), although other anneals such as vacuum anneals, oxidizing anneals, etc. can be used.

Figure 12:
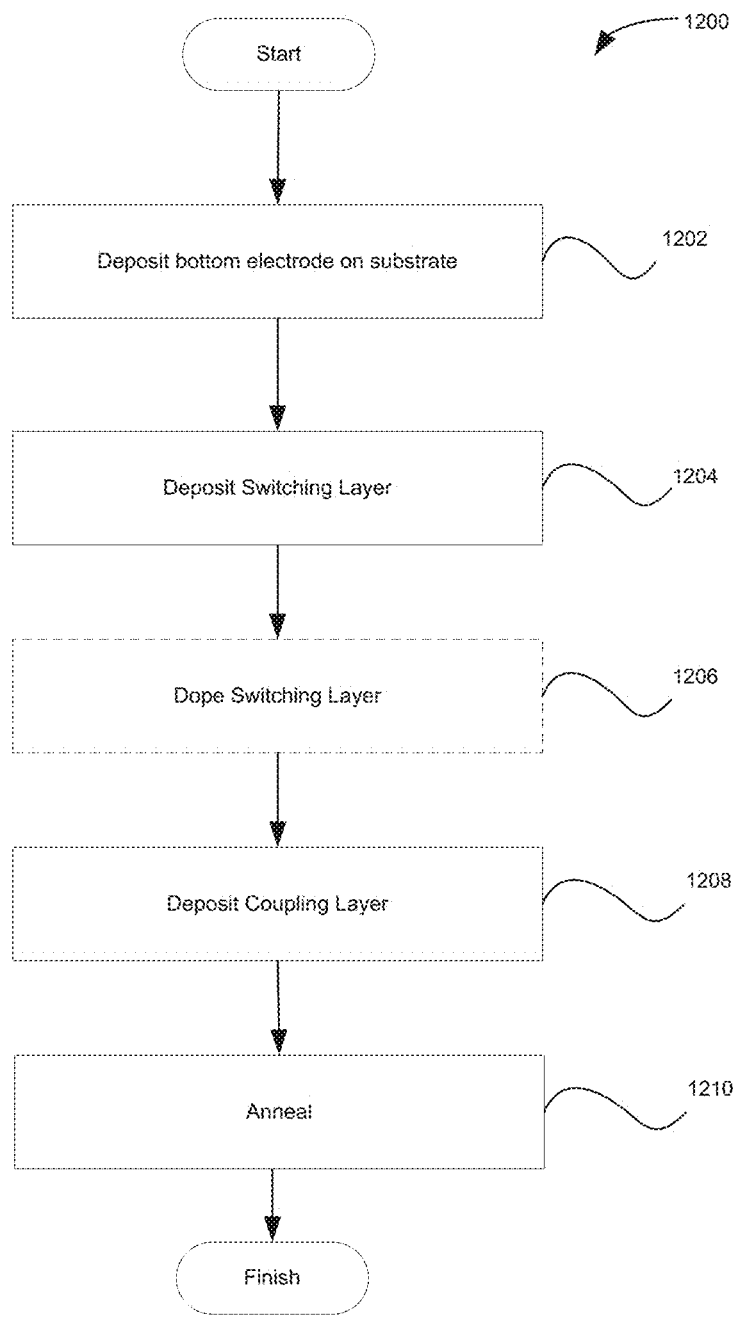
FIG. 12 is a flowchart describing a process for forming a memory element according to various embodiments.

FIG. 12 is a flowchart describing a process 1400 for forming a memory element according to various embodiments. The process 1200 can be used in conjunction with the process described in operation 1100 if so desired.

In operation 1202, a bottom electrode is deposited on a substrate. The bottom electrode can be, for example, n-type polysilicon or other materials described herein. In operation 1204, a switching layer 210 is deposited on the bottom electrode. The switching layer 210 can be any of the materials described above, for example, HfOx, CuOx, ZnOx, CeOx, etc. The switching layer 210 can be deposited using appropriate deposition techniques such as ALD or PEALD.

In operation 1206, the switching layer 210 is optionally doped. For example, the switching layer 210 can be doped to create a p-type switching layer (e.g. a p-type ZnO or CuO layer). In operation 1208 a coupling layer, such as a metallic (e.g. Ti) or metal oxide (e.g. $ZrO_2$, $Al_2O_3$) is deposited on the switching layer.

In operation 1210, the memory element is annealed, for example using a rapid thermal oxidation (RTO), a hydrogen/argon mixture, a vacuum anneal, etc. The annealing can cause oxygen to migrate from the metal oxide switching layer 210 to the coupling layer 212 in some embodiments (see e.g. FIG. 2B).

Although the foregoing examples have been described in some detail for purposes of clarity of understanding, the invention is not limited to the details provided. There are many alternative ways of implementing the invention. The disclosed examples are illustrative and not restrictive.

What is claimed:

1. A semiconductor device comprising:
a first layer operable as a first electrode;
a second layer operable as a second electrode;
a third layer disposed between the first layer and the second layer,
wherein the third layer is operable to switch between a first resistive state and a second resistive state different from the first resistive state;
wherein the third layer comprises a first portion and a second portion,
wherein the first portion comprises an oxygen deficient metal oxide,
wherein the second portion comprises a metal oxide,
wherein an oxygen concentration in the second portion is greater than an oxygen concentration in the first portion;
a fourth layer disposed between the second layer and the third layer,
the fourth layer comprising titanium; and
a fifth layer disposed between the first layer and the third layer, the fifth layer comprising silicon oxide.

2. The semiconductor device of claim 1, wherein the fourth layer comprises oxygen, and wherein a concentration of oxygen differs throughout a thickness of the fourth layer.

3. The semiconductor device of claim 2, wherein the concentration of oxygen in the fourth layer is greater at an interface with the third layer than at an interface with the second layer.

4. The semiconductor device of claim 3, wherein the fourth layer comprises substantially titanium oxide at the interface with the third layer.

5. The semiconductor device of claim 3, wherein the fourth layer comprises substantially titanium metal at the interface with the second layer.

6. The semiconductor device of claim 3, wherein the fourth layer comprises substantially titanium metal at the interface with the second layer, and wherein the second layer comprises one of titanium nitride, tantalum nitride, tungsten, nickel, copper, aluminum, or a titanium-aluminum alloy.

7. The semiconductor device of claim 1, wherein a thickness of the fourth layer is less than 25% of a thickness of the third layer.

8. The semiconductor device of claim 1, wherein the third layer comprises a two-metal oxide.

9. The semiconductor device of claim 8, wherein a first metal of the two-metal oxide is hafnium.

10. The semiconductor device of claim 9, wherein a second metal of the two-metal oxide is one of aluminum, zirconium, titanium, lanthanum, or strontium.

11. The semiconductor device of claim 9, wherein a second metal in the two-metal oxide is aluminum.

12. The semiconductor device of claim 9, wherein a second metal in the two-metal oxide is zirconium.

13. The semiconductor device of claim 9, wherein a second metal in the two-metal oxide is titanium.

14. The semiconductor device of claim 9, wherein a second metal in the two-metal oxide is lanthanum.

15. The semiconductor device of claim 9, wherein a second metal in the two-metal oxide is strontium.

16. The semiconductor device of claim 8, wherein the two-metal oxide is a nonstoichiometric metal oxide.

17. The semiconductor device of claim 16, wherein an oxygen concentration varies throughout a thickness of the third layer.

18. The semiconductor device of claim 1, wherein the third layer comprises one of p-type zinc oxide or p-type copper oxide.

19. The semiconductor device of claim 1, the third layer comprises one of cerium oxide, hafnium oxide, aluminum oxide, tantalum oxide, yttrium oxide, or zirconium oxide.

* * * * *